United States Patent [19]

Schrantz et al.

[11] Patent Number: 5,683,939
[45] Date of Patent: Nov. 4, 1997

[54] DIAMOND INSULATOR DEVICES AND METHOD OF FABRICATION

[75] Inventors: Gregory Schrantz; Jack Linn; Richard Belcher, all of Melbourne, Fla.

[73] Assignee: Harris Corporation, Palm Bay, Fla.

[21] Appl. No.: 471,759

[22] Filed: Jun. 6, 1995

Related U.S. Application Data

[62] Division of Ser. No. 42,299, Apr. 2, 1993.

[51] Int. Cl.⁶ ................................................ H01L 21/44
[52] U.S. Cl. ........................................ 437/195; 437/200
[58] Field of Search ............................. 437/195, 200, 437/235

[56] References Cited

U.S. PATENT DOCUMENTS

| | | |
|---|---|---|
| 3,877,063 | 4/1975 | Abraham et al. . |
| 4,410,867 | 10/1983 | Arcidiacono et al. . |
| 4,446,613 | 5/1984 | Beinglass et al. . |
| 4,553,050 | 11/1985 | Feinberg et al. . |
| 4,843,034 | 6/1989 | Herndon et al. . |
| 4,855,809 | 8/1989 | Malhi et al. . |
| 5,082,522 | 1/1992 | Purdes et al. ............... 156/612 |
| 5,173,761 | 12/1992 | Dreifus et al. ............... 257/22 |
| 5,330,616 | 7/1994 | Yamazaki ............... 156/643 |
| 5,391,914 | 2/1995 | Sullivan et al. ............... 257/635 |
| 5,417,798 | 5/1995 | Nishibayashi et al. ............... 216/67 |

*Primary Examiner*—Jey Tsai
*Assistant Examiner*—C. Everhart
*Attorney, Agent, or Firm*—Jaeckle Fleischmann & Mugel, LLP

[57] ABSTRACT

Semiconductor device and circuits and methods of fabrication which provides multilevel interconnections with grown diamond insulation films and second level resistors in the diamond insulation. The diamond provides both good electrical insulation and good thermal conductivity. The methods also provide capacitors with second level diamond dielectrics.

19 Claims, 10 Drawing Sheets

DIAMOND INSULATOR DEVICES AND METHOD OF FABRICATION

This is a division of application Ser. No. 08/042,299 filed Apr. 2, 1993.

FIELD OF THE INVENTION

The present invention relates to electronic semiconductor devices and methods of fabrication, and, more particularly, to semiconductor devices and fabrication methods utilizing diamond insulating layers.

BACKGROUND AND SUMMARY OF THE INVENTION

Demands for increased performance and power handling for integrated circuits and discrete devices have led to various deviations from standard silicon structures. For example, gallium arsenide based circuits are able to withstand higher temperature operation than silicon devices due to a larger bandgap, and refractory metal in place of aluminum in silicon circuits allows high temperature processing.

High power circuits have problems including the need for dissipation of heat generated at localized sources such as resistors. However, standard integrated circuit insulator materials such as silicon dioxide ("oxide") are poor thermal conductors and retard heat dissipation.

Diamond films can be grown by chemical vapor deposition ("CVD") using a mixture of hydrogen and methane at 800° C. with a hot filament, microwave, or plasma energy source. Similar to natural diamonds, such grown diamond films are both good electrical insulators and good thermal conductors. Applications of grown diamond films range from coating cutting tool surfaces to overcoat layers for integrated circuits; see for example, U.S. Pat. No. 4,972,250.

A. Joshi and R. Nimmagadda, "Erosion of Diamond and Graphite Films in Oxygen Plasmas", discusses etch rates of diamond to be on the order of 100 to 200 angstroms per minute. Other researchers suggest the possibility of even higher etch rates with different plasma configurations.

Metal silicides are discussed in *Silicon Processing for the VLSI Era*, by S. Wolf and R. N. Tauber and are metallurgically stable, thus allowing only minimal interdiffusion of the interconnect and silicon substrate. However, *Microelectronics Materials and Processing* by R. A. Levy references several publications discussing silicon dopant redistribution from silicon into metal silicides.

The present invention provides integrated circuits with at least two grown diamond films for interconnection insulation plus locates resistors in the second diamond film to utilize the high diamond thermal conductivity. Oxide masking and oxygen plasmas provide etching of diamond films. A diamond dielectric capacitor may be incorporated into the fabrication method.

BRIEF DESCRIPTION OF THE DRAWINGS

The present invention will be described with reference to the accompanying drawings which are schematic for clarity.

DESCRIPTION OF THE PREFERRED EMBODIMENTS

First Preferred Embodiment

The first preferred embodiment method provides fabrication of preferred embodiment power integrated circuits with multilevel interconnections having grown diamond insulation and passivation layers and with second level resistors. In such a structure the diamond efficiently dissipates resistor heat. This permits high power dissipation resistors in compact circuits.

The method includes the following steps:

(a) Begin with a monocrystalline silicon wafer with resistivity (e.g., 10 ohm-cm), and oxygen concentration selected for high power bipolar device fabrication. Form buried layers by implantation and thermal drivein. The buried layers will be the high conductivity collectors below the lightly doped collectors. Grow an epitaxial silicon layer on the wafer; the thickness depends upon the breakdown voltage desired and typically is several microns. Selectively dope and drivein the dopants to form the lightly doped collectors. Then successively selectively implant and diffuse dopants to form the intrinsic base, extrinsic base, emitter, and collector contact in the epitaxial layer. The high diffusion temperatures (1000+ degrees C.) and long drive times are compatible with deposition temperatures of CVD diamond (approximately 800 degrees C.) which may be higher than for oxide deposition. However, the thermal budget requirements for CVD diamond depositions are very small relative to the silicon dopant processing and, therefore, should have little if any affect on the dopant distributions.

(b) Following the implants and diffusions of step (a), chemically strip all resulting oxides from the surface of the wafer. Then thermally grow a thin oxide on the order of 100 to 150 angstroms across the surface of the entire wafer to control surface interface states.

Figure 1:
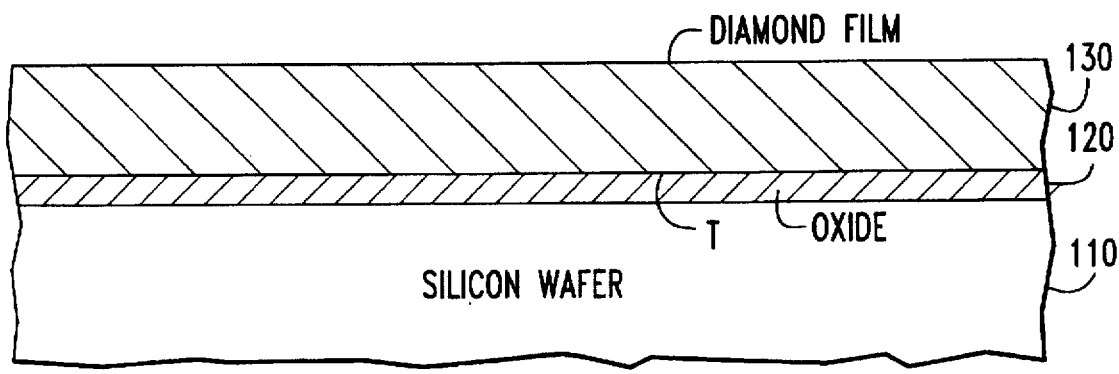
FIGS. 1–5, 6a–b, and 7–18 illustrate in cross sectional elevation views steps of preferred embodiment methods of fabrication of integrated circuits.

(c) Deposit CVD diamond on thin thermal oxide. CVD diamond has a similar dielectric constant to oxide (3.5 vs 3.9). Therefore, CVD diamond films on the order of nominal thickness of 0.5 to 1.0 µm should suffice—see FIG. 1 illustrating silicon wafer 110 (the transistor doped regions omitted for clarity) with thin oxide 120 and overlying diamond film 130.

Figure 2:
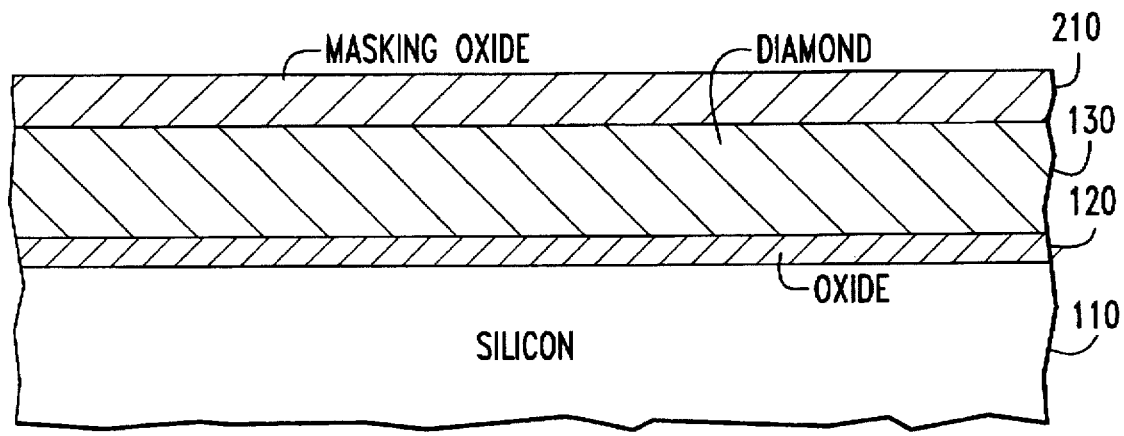

(d) Deposit CVD masking oxide 210 on CVD diamond film 130. Nominal thickness for oxide film 210 is 0.2 µm—see FIG. 2.

Figure 3:
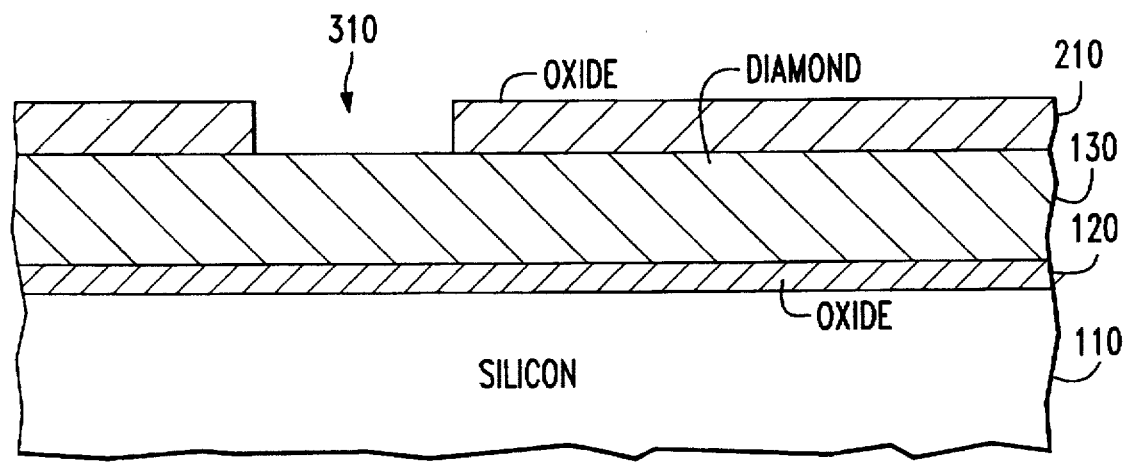

(e) Pattern masking oxide 210 with photoresist and either wet chemical etch or plasma etch (e.g., with $CF_4$, HF) oxide 210 in the photoresist aperture areas. Diamond film 130 will act as an etch stop. Strip the photoresist—see FIG. 3 showing opening 310 in oxide 210. The openings 310 would be located over emitter, base, and collector contact areas.

Figure 4:
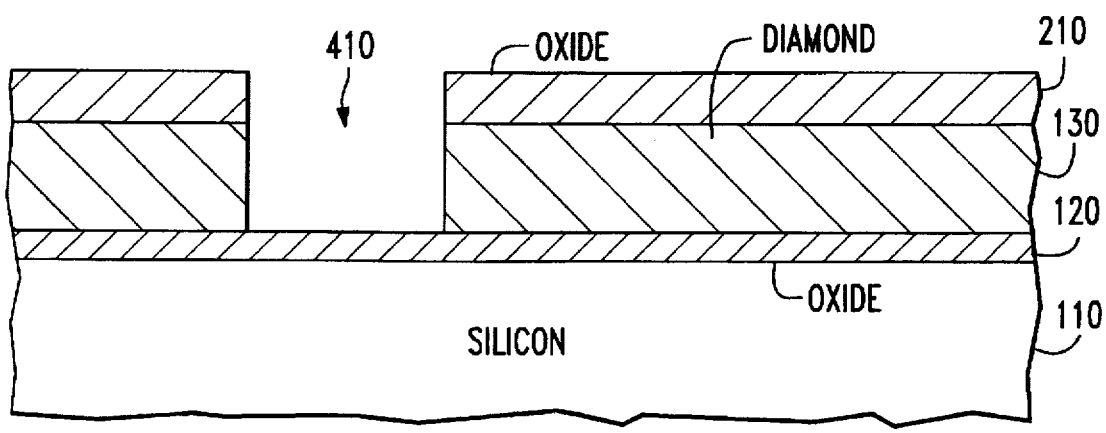

(f) Oxygen plasma etch the portion of diamond film 130 exposed through opening 310, allowing oxide 210 to function as the etch mask. The underlying thermal oxide 120 between diamond 130 and silicon 110 will function as an etch stop and plasma damage inhibitor—see FIG. 4 showing the opening 410 which extends through both oxide 210 and diamond 130.

Figure 5:
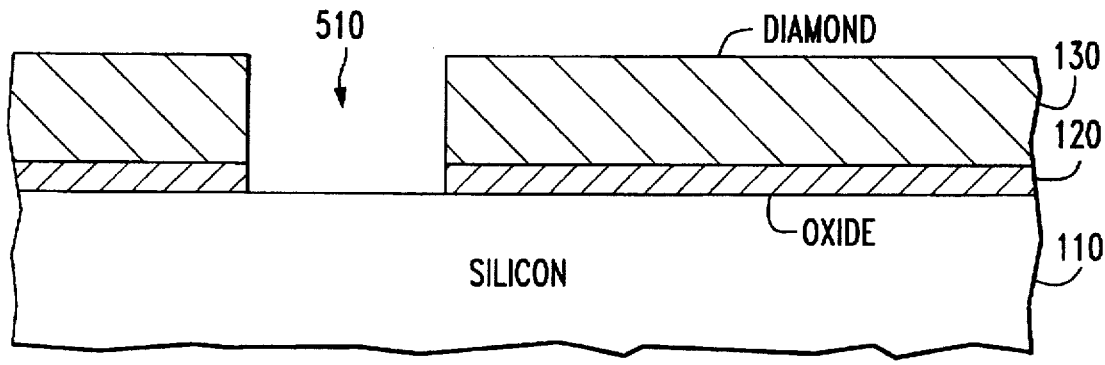

(g) Remove masking oxide 210 and also thermal oxide 120 in the aperture areas with a wet chemical strip or plasma etch—see FIG. 5 with opening 510 extending through diamond 130 and oxide 120 to emitter, base, and collector contact areas in silicon 110, although these are not explicitly shown.

Figure 6A:
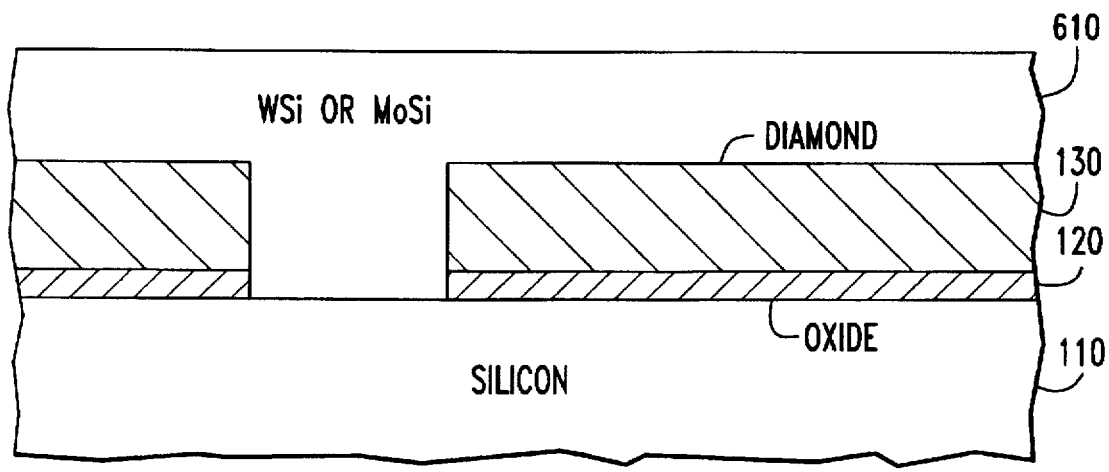
Figure 6B:
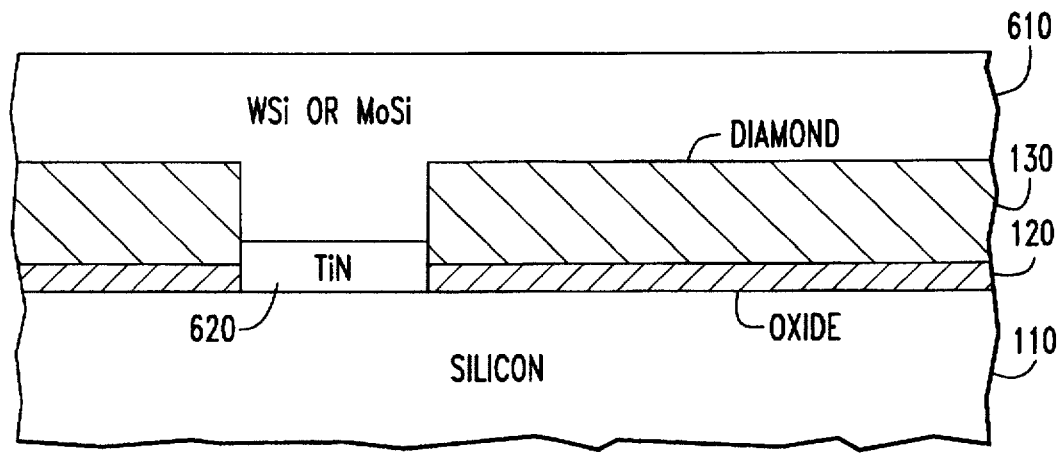

(h) Sputter deposit refractory metal silicide (e.g., $WSi_x$, $MoSi_x$) film 610 to form aperture silicon/metal contact and to function as the first level interconnect. To further insure that dopant redistribution into metal silicide 610 is minimized, titanium nitride or titanium-tungsten nitride barrier 620 (500–1000 angstroms thick) can be deposited in the contacts before the metal silicide deposition; see U.S. Pat. No. 4,753,851. The TiN can be patterned and left only in the contact or it can be left covering the contacts and diamond. TiN can be wet etched in HF or dry etched in fluorinated plasmas. Most silicides and the TiN can be sputter deposited and are stable to temperatures above 1000 degrees C. The resistivity for $WSi_x$ is on the order of 20–50 microohms-cm—FIG. 6a shows the contact without TiN barrier 620 and FIG. 6b shows the contact with TiN barrier 620.

Figure 7:
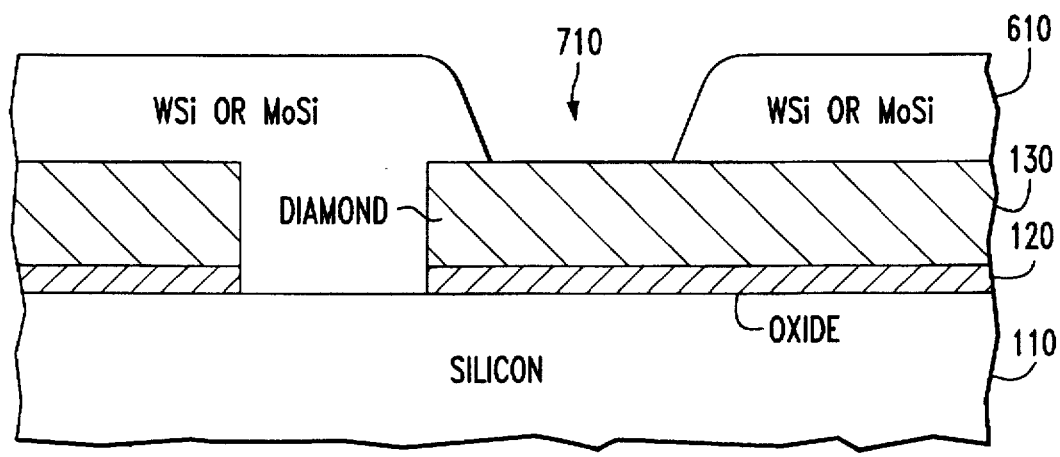

(i) Pattern silicide 610 with photoresist and delineate the interconnects as desired. Diamond film 130 will function as an etch stop for a silicide etch such as aqua regia, which is isotropic. Strip the photoresist—FIG. 7 shows resulting opening 710 in silicide film 610.

Figure 8:
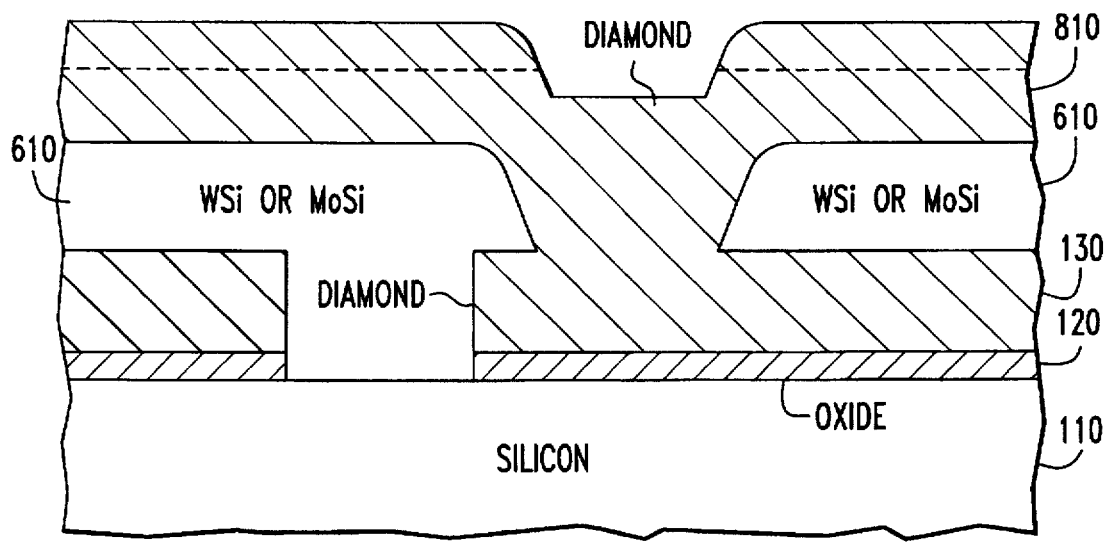

(j) Deposit a second CVD diamond film 810 over all areas and with 1 to 3 μm nominal thickness; the thickness will depend on the degree of planarization required. Diamond growth/adhesion to diamond film 130 and refractory metal silicide 610 is highly compatible and conformal—FIG. 8 shows diamond 810 merging with diamond 130 in opening 710.

Planarization of second level diamond 810 may be desired. This involves spinning on planarizing photoresist and exposing the diamond/photoresist surface to an oxygen plasma. The high points in the diamond film will be etched, while the low areas will be somewhat protected by the photoresist. Continue the oxygen plasma etch until the desired level of planarization is obtained or until the photoresist is removed. The broken line in FIG. 8 indicates planarization.

Figure 9:
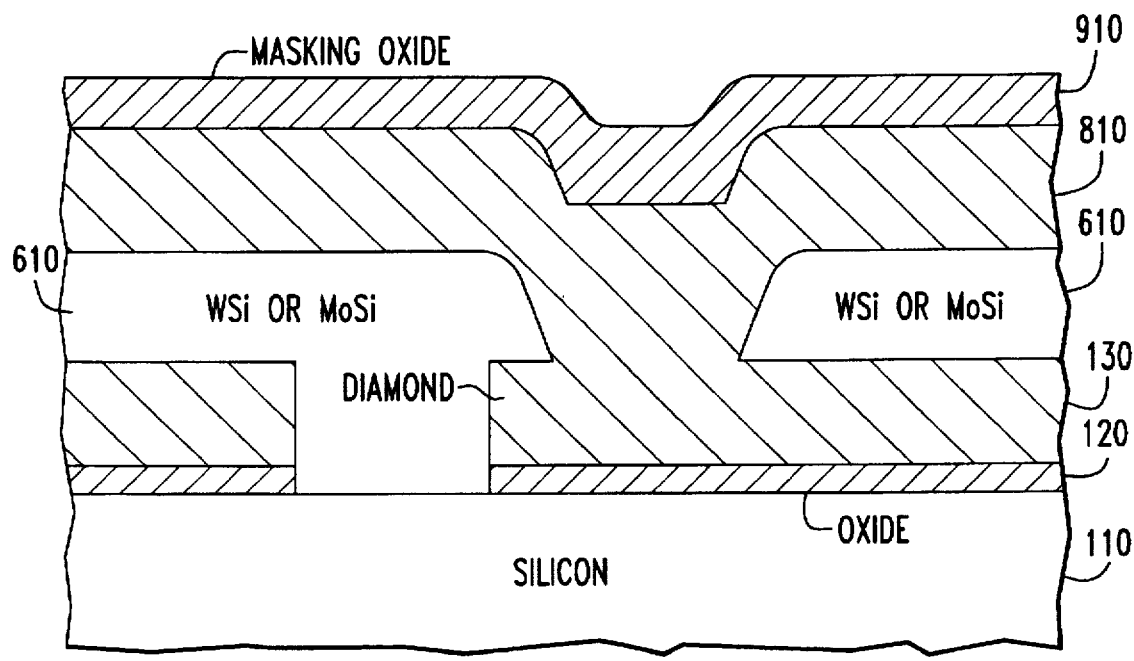

(k) Deposit conformal CVD masking oxide 910 diamond film 810—see FIG. 9.

Figure 10:
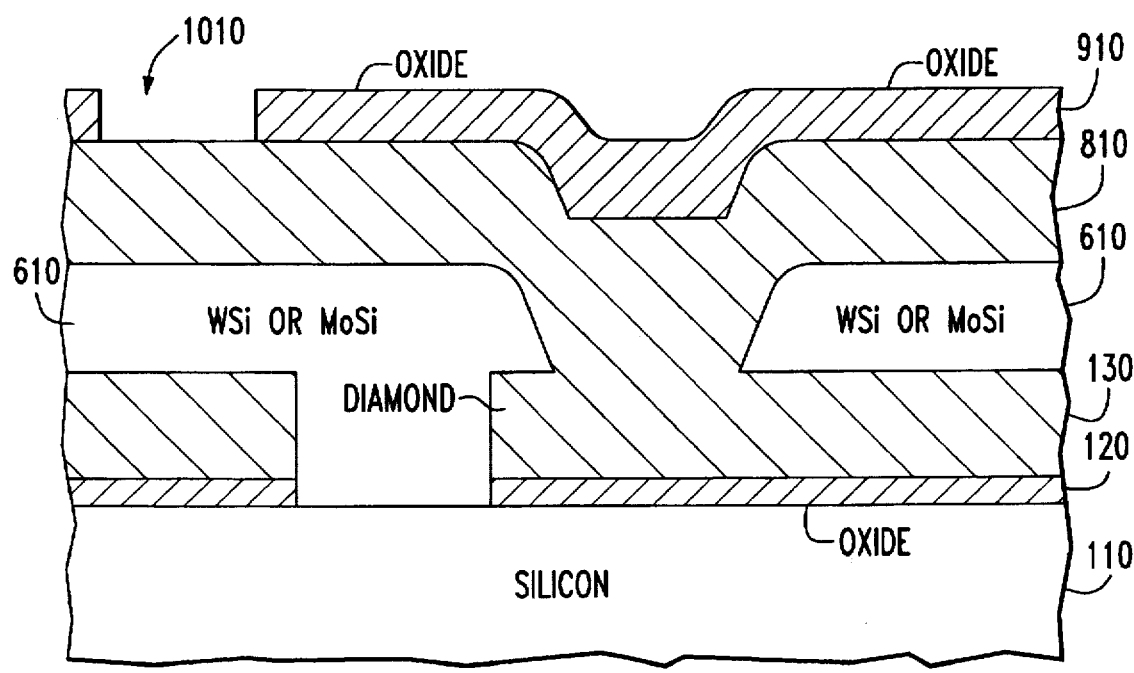

(l) Pattern masking oxide 910 with photoresist to define locations for polysilicon resistors and either wet chemical etch or plasma strip the exposed oxide. Strip the photoresist—FIG. 10 shows opening 1010 in oxide 910.

Figure 11:
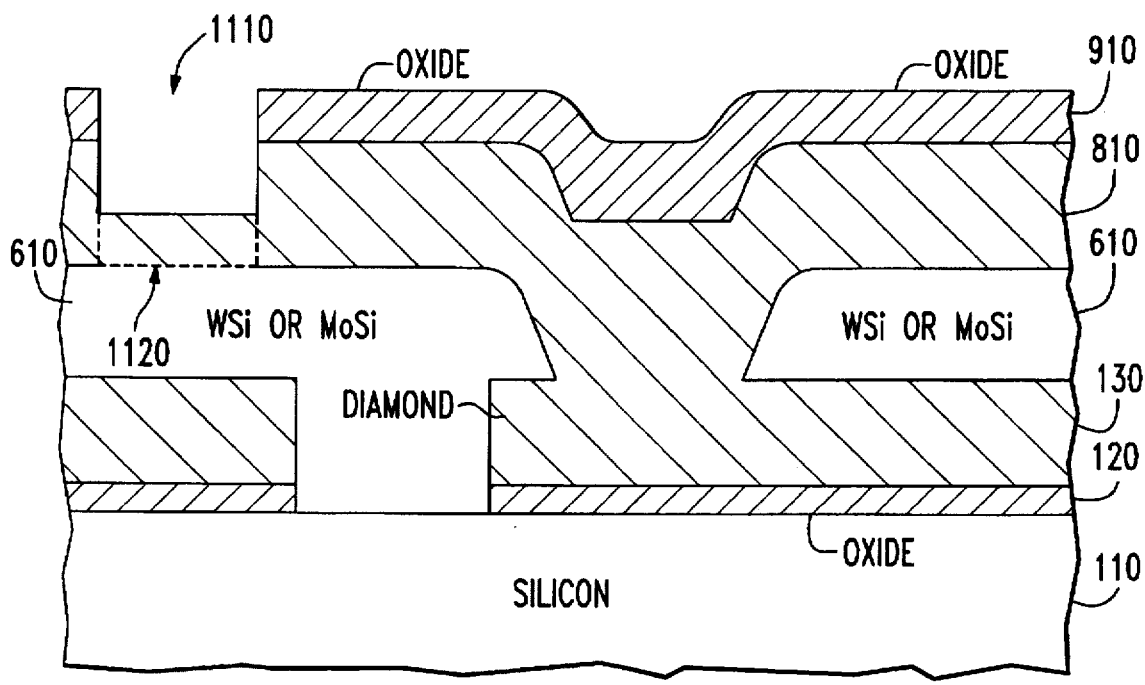

(m) Oxygen plasma etch the exposed portion of diamond film 810 (the locations for the polysilicon resistors). Terminate the etching after creating trenches about approximately 0.2–0.3 μm deep in diamond film 810. Portions of the trench can be further etched through diamond 810 to metal silicide 610 during the subsequent via etch, allowing the polysilicon resistor ends to make direct contact to first level interconnect—FIG. 11 shows trench 1110 for a polysilicon resistor and in dotted lines trench extension 1120 connecting to silicide 610.

Figure 12:
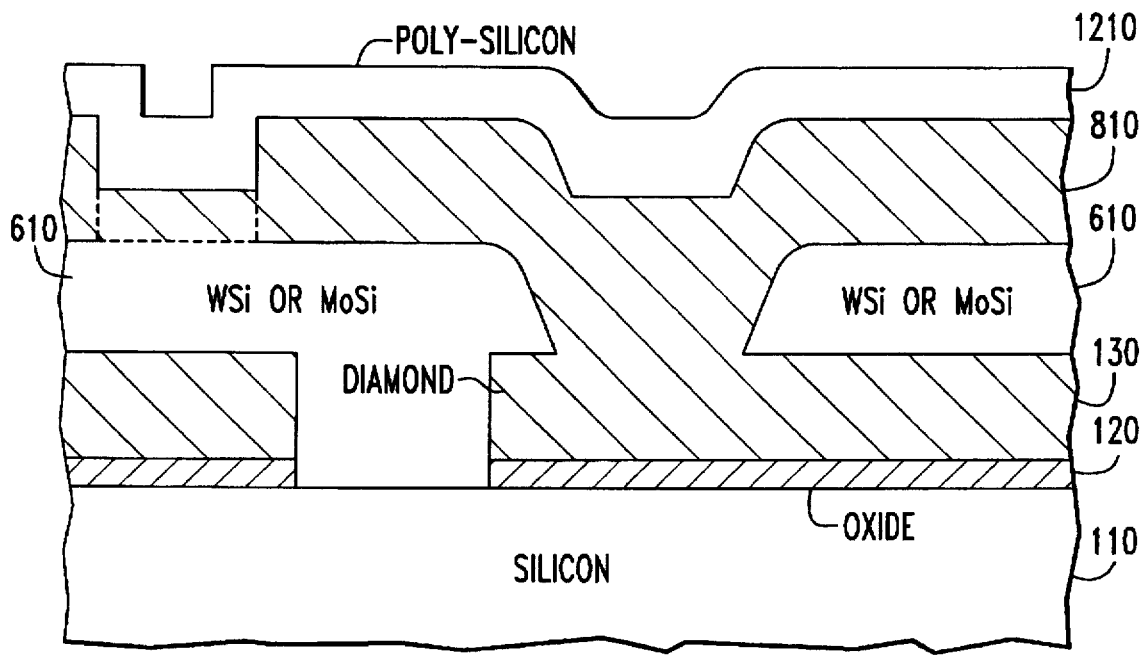

(n) Remove masking oxide 910 with a wet chemical or plasma strip. Then conformally deposit polysilicon 1210 over the entire diamond 810 surface, including filling trenches 1110 and silicide contact trench extensions 1120. See FIG. 12.

Figure 13:
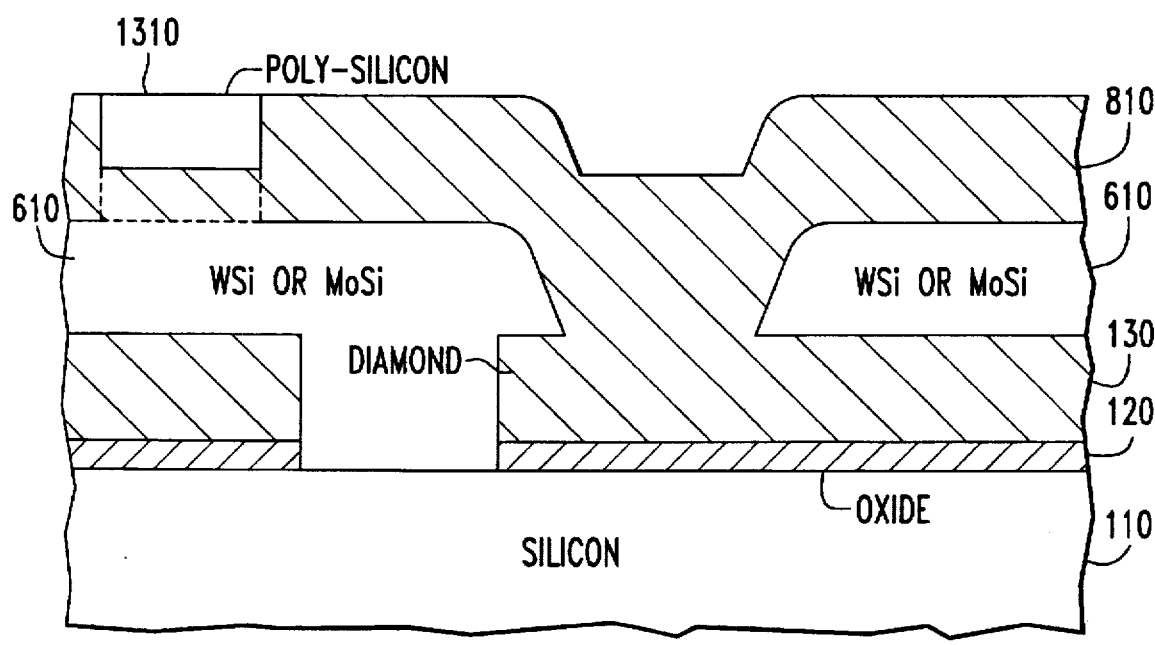

(o) Polish polysilicon 1210 back to the diamond film 810 level, using the diamond as a polishing stop. The polishing uses a basic diamond grit slurry. Spin on and pattern photoresist to cover polysilicon resistors 1310, and dry etch the remaining polysilicon from the low topographical areas if diamond planarization was not complete in step (j). Remove the remaining photoresist. See FIG. 13. Alternatively, the polysilicon resistors can be deposited on top of second level diamond 810, without etching the resistor trench 1110 in the diamond. The polysilicon can be patterned with photoresist and etched with a fluorinated plasma, using the diamond as an etch stop. This eliminates the need for a planar second level diamond 810. Also, other high temperature resistor materials compatible with this process could be deposited and patterned in place of the polysilicon. Such materials include tantalum nitride (TAN). The electrical characteristics of TaN are discussed in a technical note published by Micropac Industries, Inc. TaN has usable sheet resistance values between 25 and 500 ohms/sq.

Figure 14:
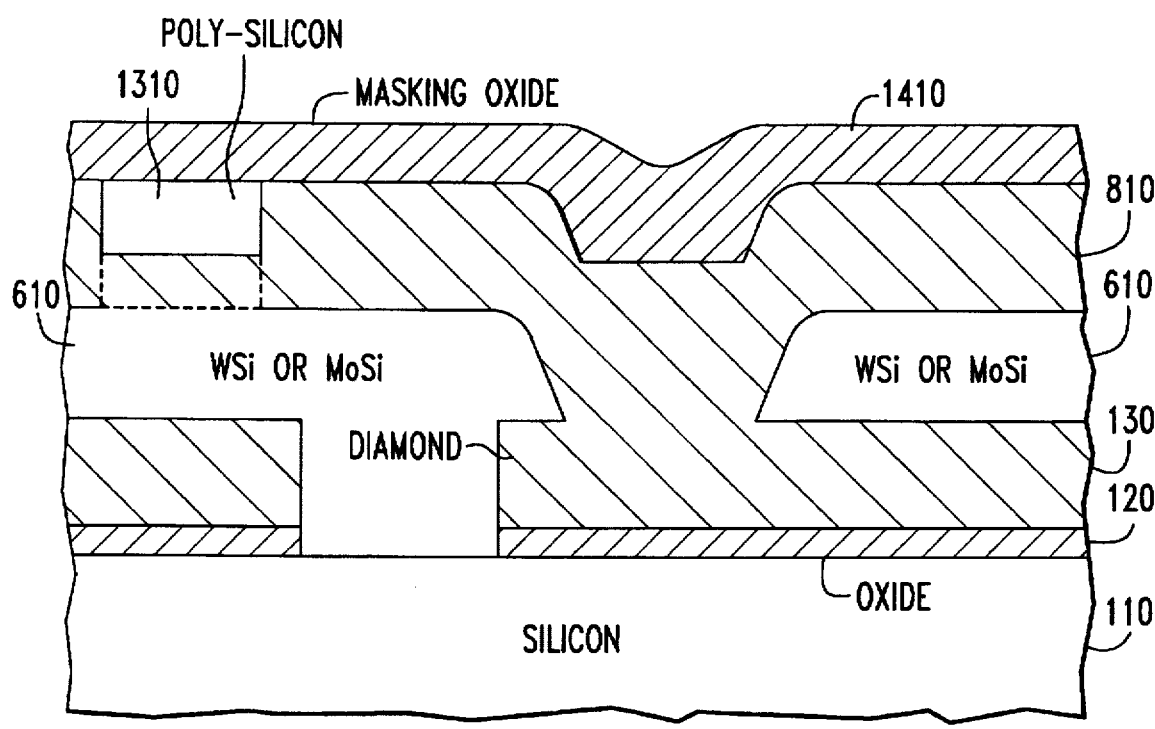

(p) Deposit CVD masking oxide 1410 of thickness roughly 0.05 μm over the second diamond layer 810 and polysilicon 1310 filled trenches. Spin on and pattern photoresist on oxide 1410 and implant through oxide 1410 only polysilicon resistors 1310 to the correct dopant level. Remove photoresist and activate/diffuse the dopants. See FIG. 14.

Figure 15:
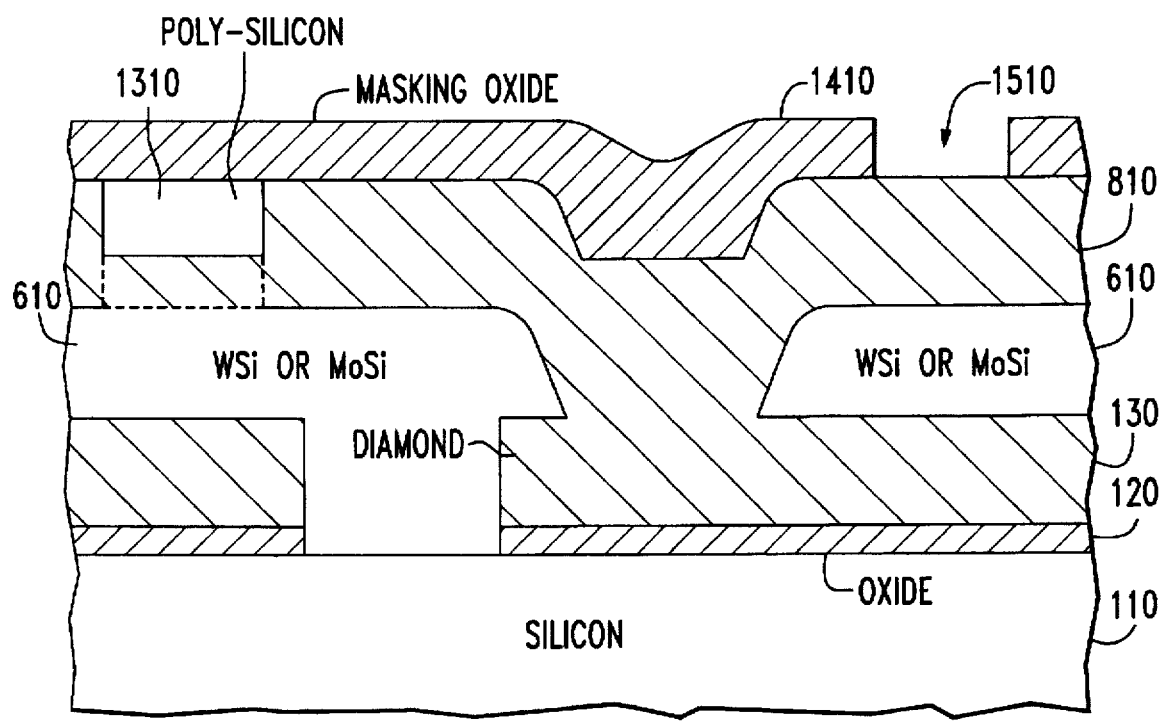

(q) Pattern masking oxide 1410 with photoresist and wet chemical or plasma etch oxide 1410 in the locations for vias to first level metal 610 and resistor contact areas. The diamond will again function as the etchstop. See FIG. 15 showing etched opening 1510 in oxide 1410.

Figure 16:
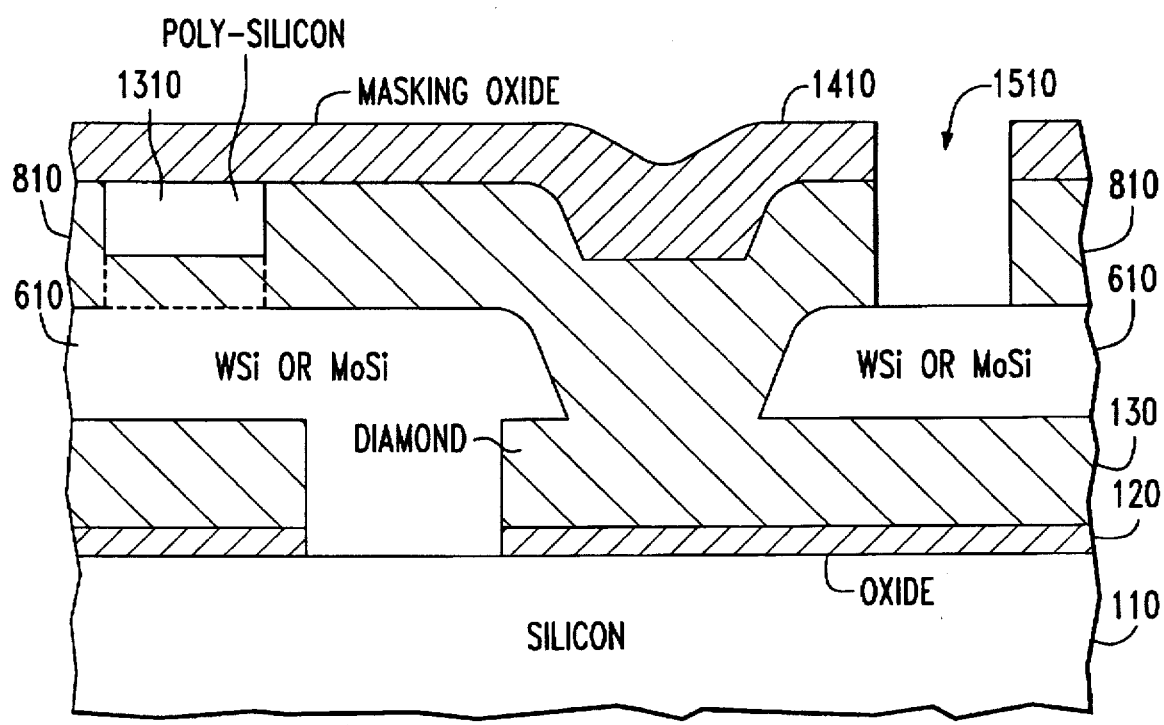

(r) Oxygen plasma etch the exposed portion of diamond film 810 in opening 1510 (location for vias), allowing CVD oxide 1410 to function as the etch mask over the remaining diamond film 810 and polysilicon resistors 1310. See FIG. 16 illustrating opening 1510 extended to silicide 610.

Figure 17:
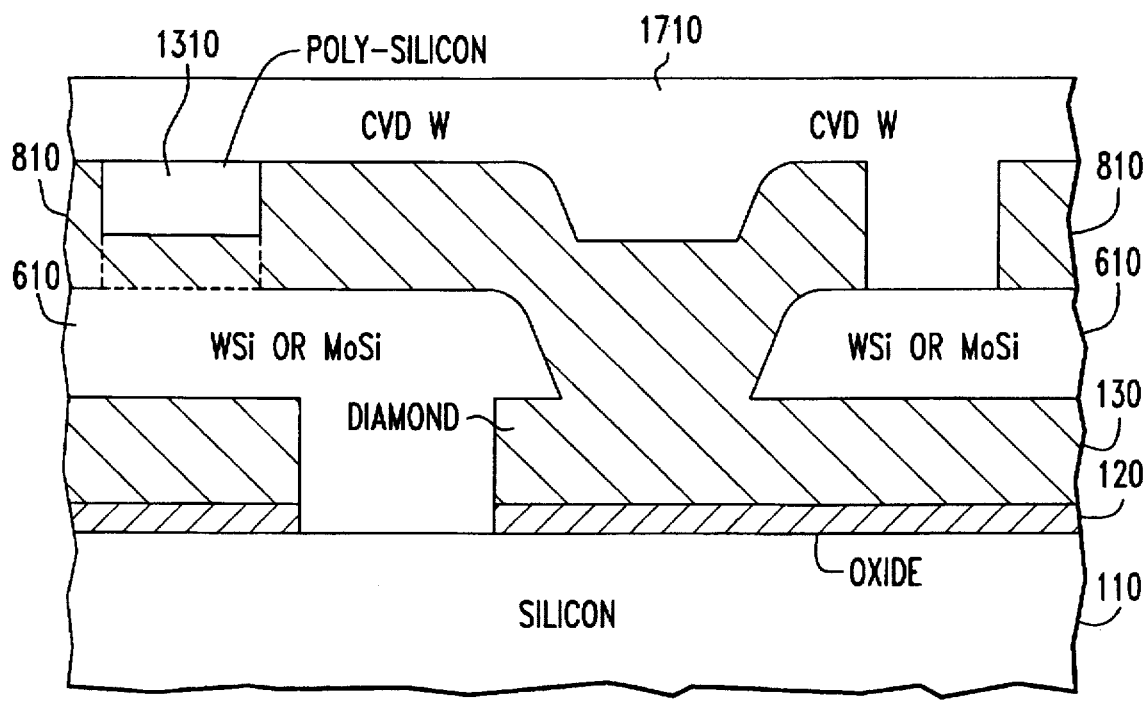

(s) Remove masking oxide 1410 with a wet chemical strip or plasma etch. This strip removes the oxide over diamond 810 and over polysilicon resistors 1310. Deposit LPCVD tungsten to a thickness of 0.2 μm over the wafer to form via contacts to first level interconnect silicide 610 and function as the second level interconnect and as contacts to polysilicon resistors 1310. see FIG. 17.

Figure 18:
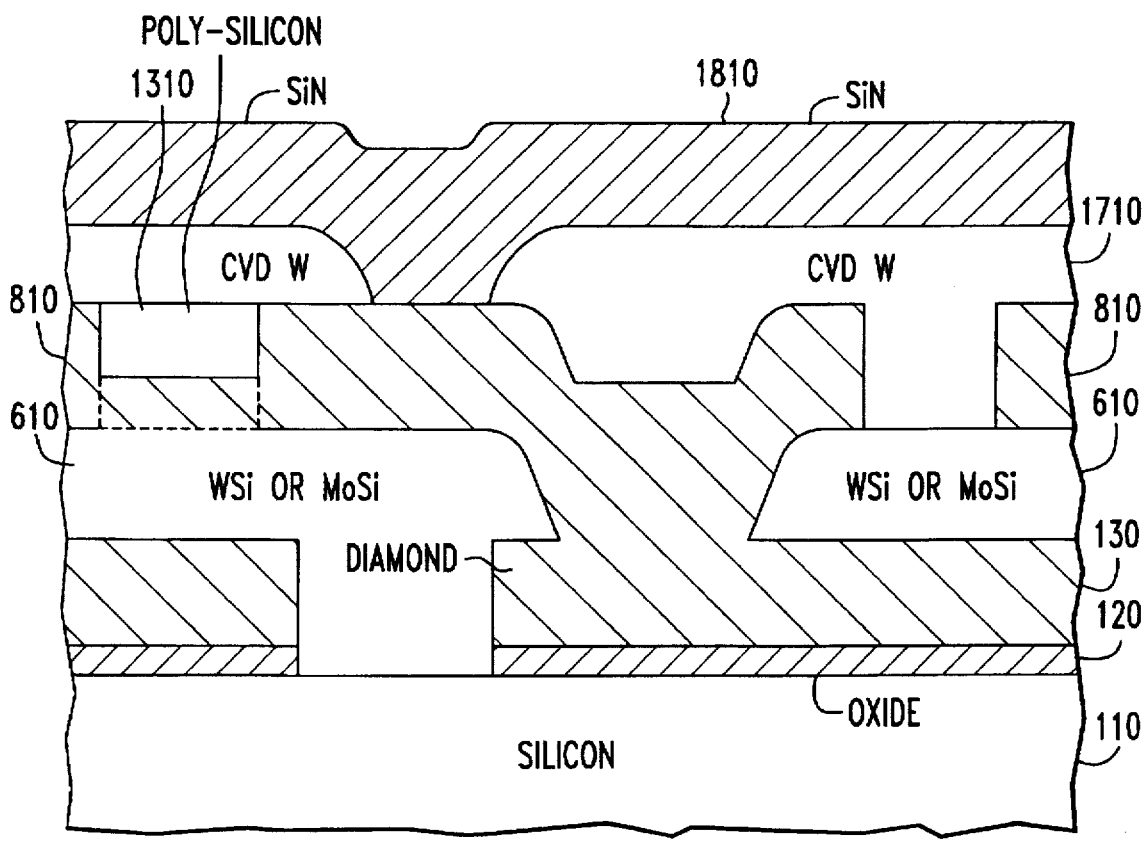

(t) Pattern second level tungsten interconnect 1710 with photoresist and wet etch or plasma etch, making certain to remove tungsten 1710 from all exposed polysilicon areas, except where second level interconnect contact is desired such as the ends of resistor 1310. Then deposit silicon nitride overcoat 1810, thus covering all interconnect and polysilicon resistors with dielectric layer. See FIG. 18. Opening up bond pad locations in overcoat 1810 completes the wafer processing.

Figure 19A:
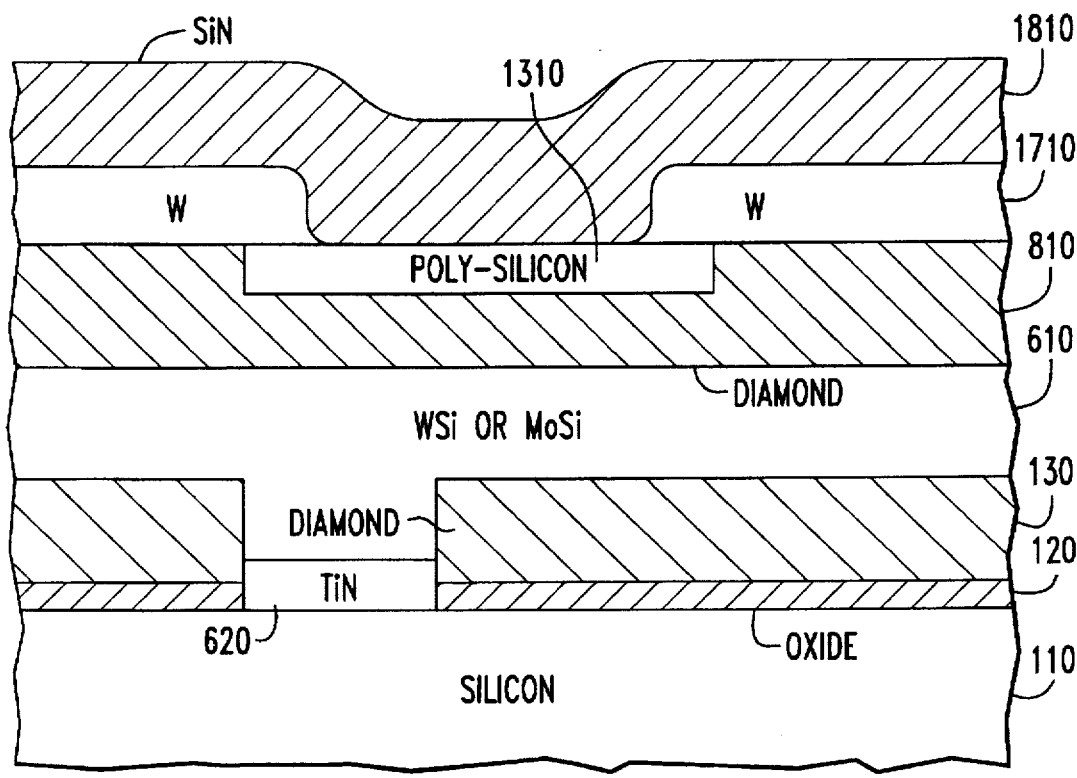
FIGS. 19a–b show alternate resistor structures in preferred embodiment integrated circuits.
Figure 19B:
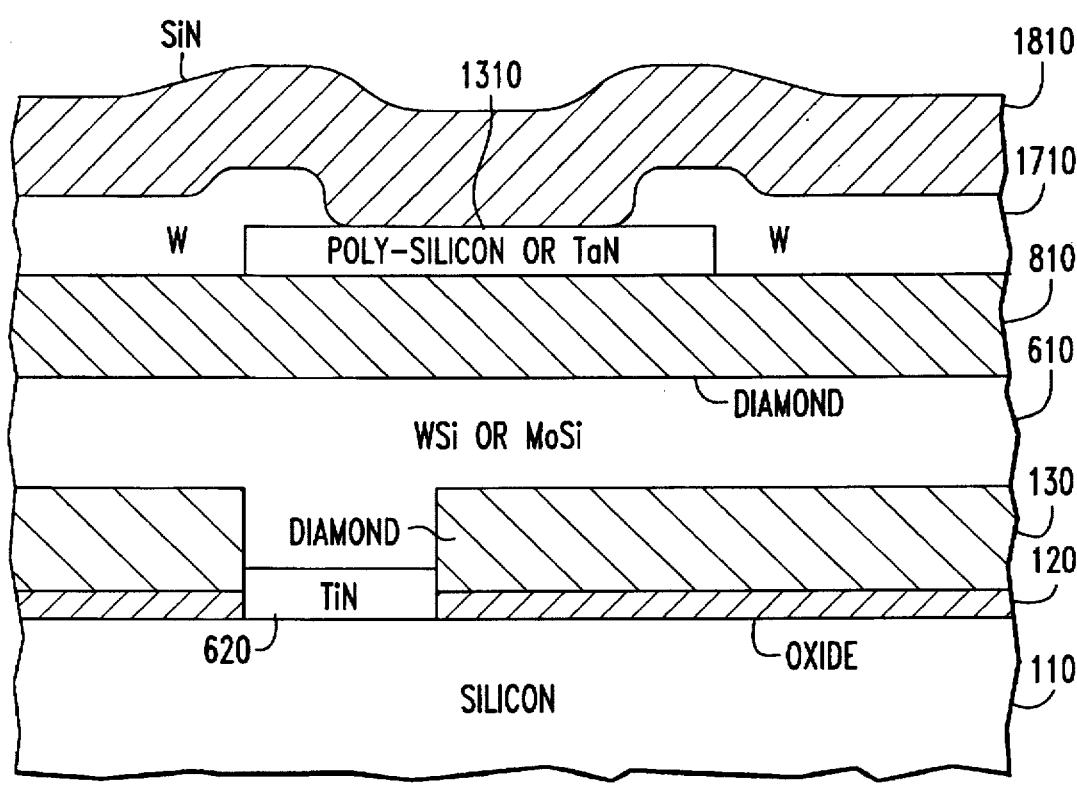

The location of resistors 1310 in trenches in diamond 810 with overcoat 1810 covering the top or with resistors 1310 sitting on diamond 810 with overcoat 1810 covering the sides and top insures good heat dissipation due to the high thermal conductivity of diamond. FIG. 19a shows resistor 1310 in a trench in diamond 810 with second level interconnect tungsten 1710 making end contacts, and FIG. 19b shows resistor 1310 sitting on diamond 810, again with second level interconnect making end contacts.

Figure 20:
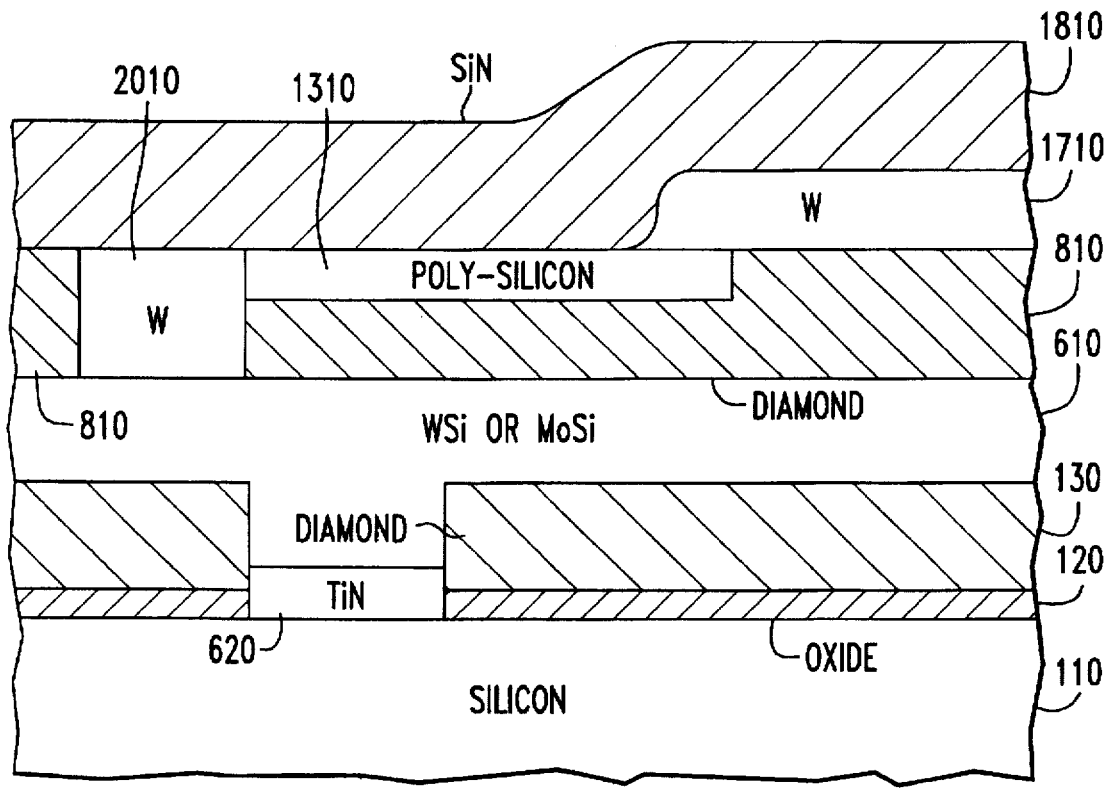
FIG. 20 shows an alternate resistor to interconnect connection.

FIG. 20 shows a via to first level interconnect (see via 1510 in FIG. 16) formed at one end of polysilicon resistor 1310, and with second level interconnect tungsten patterned to form the usual interconnect 1710 plus form a plug 2010 connecting the end of resistor 1310 to first level interconnect. This provides a compact structure which retains the good thermal dissipation by diamond 810.

Capacitors

Figure 21:
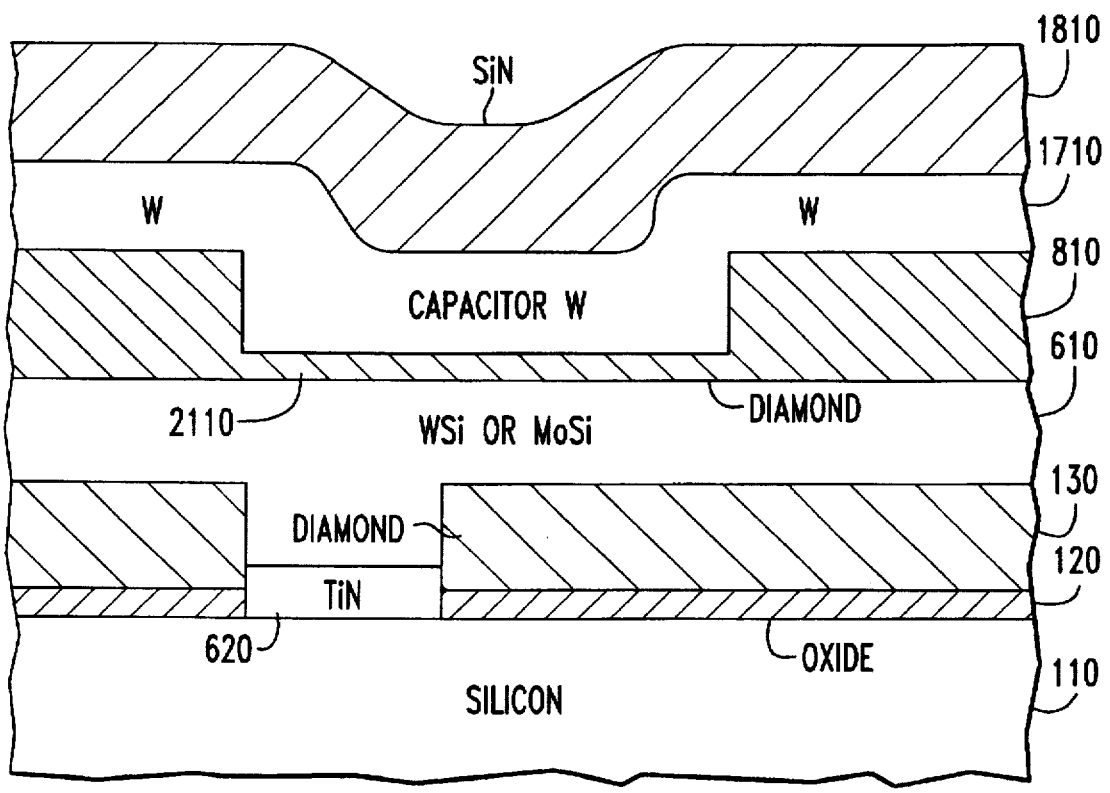
FIG. 21 is a cross sectional elevation view of a capacitor incorporated into a preferred embodiment.

FIG. 21 shows formation of a capacitor with diamond dielectric 2110 between plates made of first level interconnect silicide 610 and second level interconnect tungsten 1710. This permits capacitors to be incorporated into the structures made by the first preferred embodiment method with minimal added processing steps. As previously noted, the dielectric constant of diamond (3.5) is close to that of oxide (3.9), so diamond films on the order of hundreds of angstroms thick suffice for capacitor dielectric use. The capacitor dielectric 2110 is made by a trench etch of second level diamond 810 analogous to the trench etching shown in FIG. 11 for polysilicon resistor trenches, but the capacitor trench is deeper than the resistor trench 1110, however the capacitor trench does not extend through diamond 810 as does via 1120. The slow etching rate of diamond permits accurate control of the capacitor dielectric 2110 thickness.

An alternative method to form the capacitor dielectric could be by interrupting the growth of second level diamond film 810 as follows. After the first level interconnect patterning (see step (i) and FIG. 7), grow a few hundred angstroms of second film diamond, then deposit a capacitor upper plate metal film (silicide again). Next, pattern and etch the metal film to form the capacitor upper plate, and then continue the growth of the second diamond film 810. Then when vias are etched through diamond 810 for first level interconnect contact (see steps (l)–(m) and FIGS. 15–16), form a via down to the upper capacitor plate. Thus the upper capacitor plate will connect to the second level interconnect and the other capacitor plate will connect to first level interconnect as with the capacitor of FIG. 21.

Features

The preferred embodiment methods and the structures formed by the preferred embodiment methods have the following features:

1. High thermal dissipation in structures due to the diamond insulation films, especially around the resistors.
2. High structure operating temperatures due to the good thermal dissipation and refractory materials (no aluminum).
3. Titanium nitride and titanium-tungsten nitride as dopant diffusion barriers between silicide and silicon.
4. Deposited oxide films as etch mask for diamond films;
5. Vertical integration of resistors on second level diamond;
6. Plasma trenching of diamond for resistor trenches or capacitor plate trenches.
7. The formation of polysilicon resistors in diamond trenches permits a grind-polish-plasma etch removal of polysilicon using the diamond as a grind-etch stop.
8. Tantalum nitride resistors on diamond insulating films for good thermal dissipation.
9. Diamond dielectric capacitor compatible with diamond insulating films.

Modifications and Variations

Modifications and variations of the preferred embodiments which retain the features of diamond films for simultaneous good thermal conductivity and good electrical insulation and high temperature operation include: the use of other semiconductor materials such as gallium arsenide; other device structures such as field effect transistors (MOS or JFET) with a gate level polysilicon film deposited and patterned prior to the first diamond film deposition, this would include DMOS devices, MOS-controlled thyristors (MCT), and insulated gate bipolar transistors (IGBT); and various integrated circuits.

What is claimed is:

1. A method of fabrication of integrated circuits, comprising the steps of:
   (a) forming a silicon dioxide film on an entire semiconductor substrate containing transistor doped regions;
   (b) forming a first diamond film on the entire silicon dioxide film;
   (c) forming openings in said first diamond film which extend to said semiconductor substrate;
   (d) forming a first conductive film over said first diamond film, said first conductive film extending to said semiconductor substrate;
   (e) patterning said first conductive film to expose portions of said first diamond film; and
   (f) forming a second diamond film over said patterned first conductive film and adjoining to said exposed portions of said first diamond film.

2. The method of claim 1, wherein:
   (a) said semiconductor substrate is a silicon substrate.

3. The method of claim 2, wherein:
   (a) the silicon dioxide film has a thickness ranging between 100 to 150 angstroms.

4. The method of claim 1, wherein:
   (a) said first conductive film is a metal silicide with adherence for grown diamond.

5. The method of claim 1, comprising the further step of:
   (a) prior to said step (c) of forming a first conductive film, forming a dopant diffusion barrier of a first material on portions of said semiconductor substrate exposed through openings in said first diamond film, said first material selected from the group consisting of titanium nitride and titanium-tungsten nitride.

6. The method of claim 1, comprising the further steps of:
   (a) forming a resistor on said second diamond film.

7. The method of claim 6, wherein:
   (a) said step of forming a resistor includes the substeps of:
      (i) forming a trench in said second diamond film; and
      (ii) filling said trench with polysilicon.

8. The method of claim 7, wherein:
   (a) said substep (ii) of filling said trench includes depositing a film of polysilicon followed by a grinding/polishing/plasma etch of said polysilicon with said second diamond film acting as a grinding/etch stop.

9. The method of claim 6, wherein:
   (a) said substep (i) of forming a trench includes coveting said second diamond film with a patterned silicon dioxide film and etching said second diamond film with an oxygen plasma using said patterned silicon dioxide film as an etch mask.

10. The method of claim 6, wherein:
    (a) said step of forming a resistor includes the substeps of:
       (i) depositing a film of resistor material on said second diamond film; and
       (ii) patterning said film of resistor material to form said resistor.

11. The method of claim 10, wherein:

(a) said resistor material is tantalum nitride.

12. The method of claim 1, comprising the further steps of:

(a) forming openings in said second diamond film;

(b) depositing a second conductive film over said second diamond film; and (c) patterning said second conductive film to form second level interconnections, including connections to said first level interconnections through said openings in said second diamond film.

13. The method of claim 12, comprising the further steps of:

(a) prior to said step (a) of forming openings, forming resistors at the surface of said second diamond film; and (b) wherein said second level interconnections connect to said resistors.

14. The method of claim 13, wherein:

(a) said forming resistors includes the substeps of (i) forming a trench in said second diamond film and (ii) filling said trench with polysilicon.

15. The method of claim 14, wherein:

(a) said step of forming openings in said second diamond film includes an opening abutting a first of said resistors; and (b) wherein one of said second level interconnections connects said first resistor to one of said first level interconnections.

16. A method of fabrication of integrated circuits, comprising the steps of:

(a) forming a silicon dioxide film on an entire semiconductor substrate containing transistor doped regions;

(b) forming a first diamond film on the entire silicon dioxide film;

(c) forming openings in said first diamond film;

(d) forming a first conductive film over said first diamond film, said first conductive film is a metal silicide with adherence for grown diamond;

(e) patterning said first conductive film to expose portions of said first diamond film; and (f) forming a second diamond film over said patterned first conductive film and adjoining to said exposed portions of said first diamond film.

17. A method of fabrication of integrated circuits, comprising the steps of:

(a) forming a first diamond film over a semiconductor substrate containing transistor doped regions;

(b) forming openings in said first diamond film;

(c) forming a first conductive film over said first diamond film;

(d) patterning said first conductive film to expose portions of said first diamond film;

(e) forming a second diamond film over said patterned first conductive film and adjoining to said exposed portions of said first diamond film; and (f) forming a resistor on said second diamond film.

18. A method of fabrication of integrated circuits, comprising the steps of:

(a) forming a silicon dioxide film on an entire semiconductor substrate containing transistor doped regions;

(b) forming a first diamond film on the entire silicon dioxide film;

(c) forming openings in said first diamond film;

(d) forming a first conductive film over said first diamond film;

(e) patterning said first conductive film to expose portions of said first diamond film;

(f) forming a second diamond film over said patterned first conductive film and adjoining to said exposed portions of said first diamond film;

(g) forming openings in said second diamond film;

(h) depositing a second conductive film over said second diamond film; and (i) patterning said second conductive film to form second level interconnections, including connections to said first level interconnections through said openings in said second diamond film.

19. The method of claim 16 wherein:

(a) the silicon dioxide film has a thickness ranging between 100 to 150 angstroms.

* * * * *